United States Patent [19]

Maroney

[11] Patent Number: 5,781,416
[45] Date of Patent: Jul. 14, 1998

[54] SELF-ADJUSTING STATIC DISSIPATIVE SHELF ASSEMBLY

[76] Inventor: Ralf P. Maroney, 785 Oak Tree Rd., Orange, Conn. 06477

[21] Appl. No.: 227,051

[22] Filed: Apr. 13, 1994

[51] Int. Cl.[6] ................................................ H05K 7/14
[52] U.S. Cl. .................. 361/800; 361/796; 361/802; 361/816; 174/35 TS
[58] Field of Search ........................ 361/800, 752, 361/756, 759, 796, 802, 816; 174/17 R, 35 TS; 211/41; 248/27.1, 27.3; 439/154–159; 220/402

[56] References Cited

U.S. PATENT DOCUMENTS

| | | | |
|---|---|---|---|
| 3,405,001 | 10/1968 | Iler | 117/121 |
| 4,223,368 | 9/1980 | Dattilo | 361/220 |
| 4,231,901 | 11/1980 | Berbeco | 252/511 |
| 4,277,120 | 7/1981 | Drake et al. | 312/320 |
| 4,293,070 | 10/1981 | Ohlbach | 206/328 |
| 4,506,785 | 3/1985 | Seefeldt | 206/334 |
| 4,555,744 | 11/1985 | Maroney et al. | 361/212 |
| 4,563,722 | 1/1986 | Maroney et al. | 361/212 |

*Primary Examiner*—Leo P. Picard
*Assistant Examiner*—Y. Whang

[57] ABSTRACT

A pair of self-adjusting shelf assemblies, each made from static dissipative material and mounted in spaced relation in a storage chamber. Each assembly has a fixed, first unit and a relatively movable second unit which is self-adjusting upon insertion of a circuit board between a facing second unit of one shelf assembly and the fixed first unit of the other shelf assembly to accommodate different heights of circuit boards stored therebetween in the chamber.

22 Claims, 6 Drawing Sheets

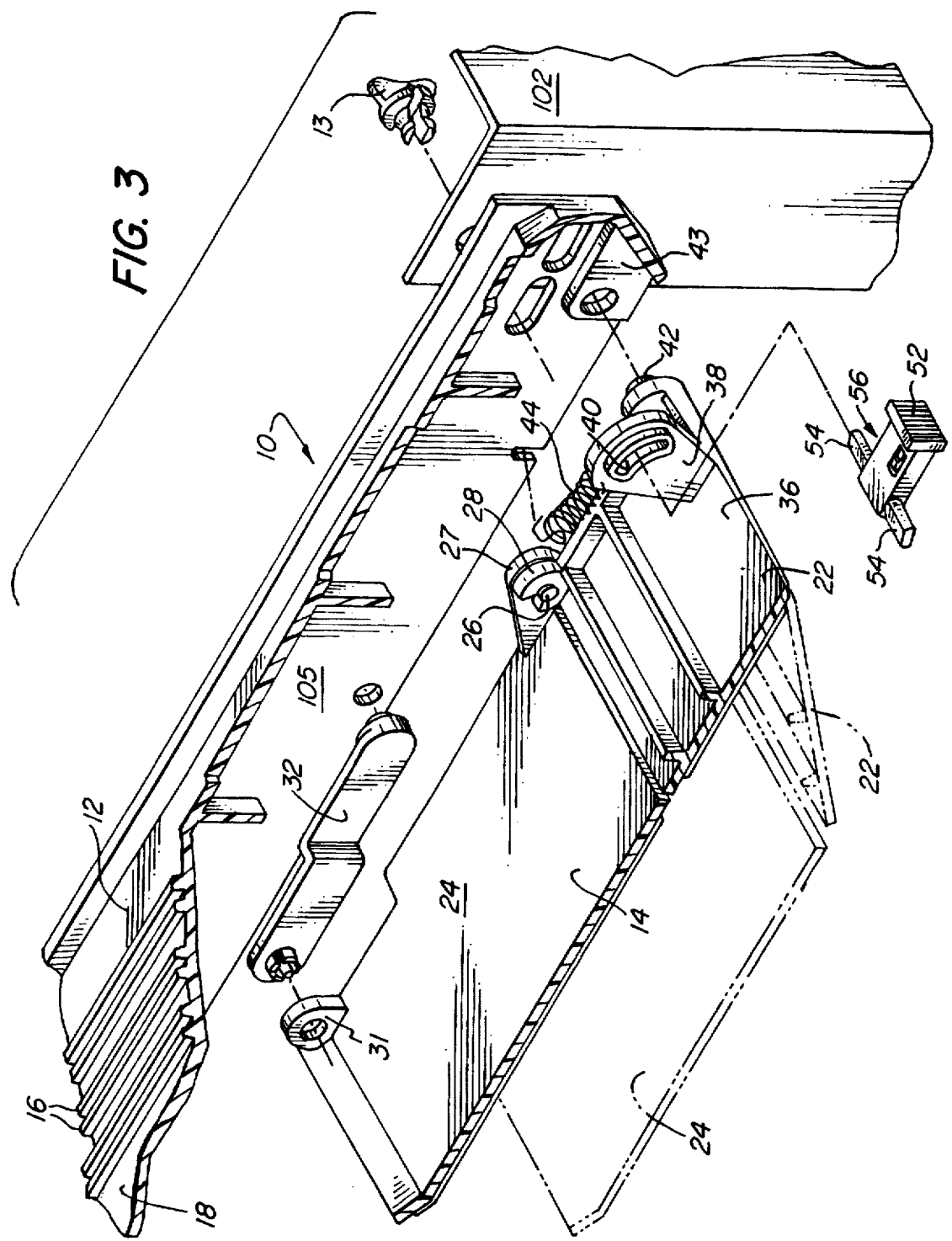

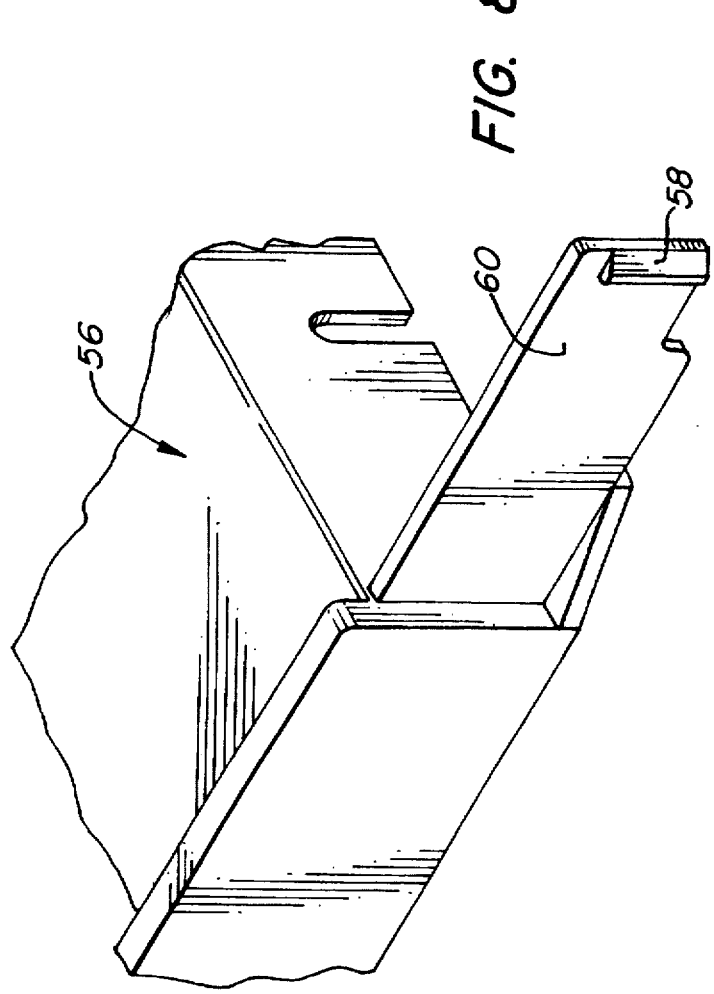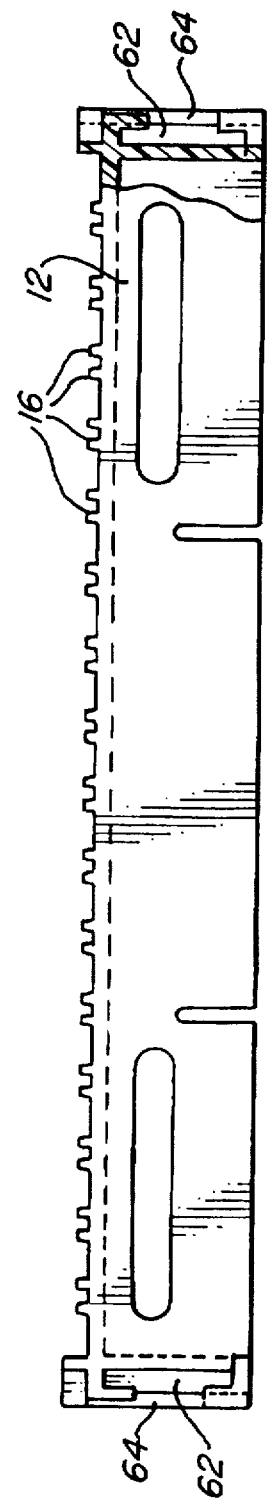

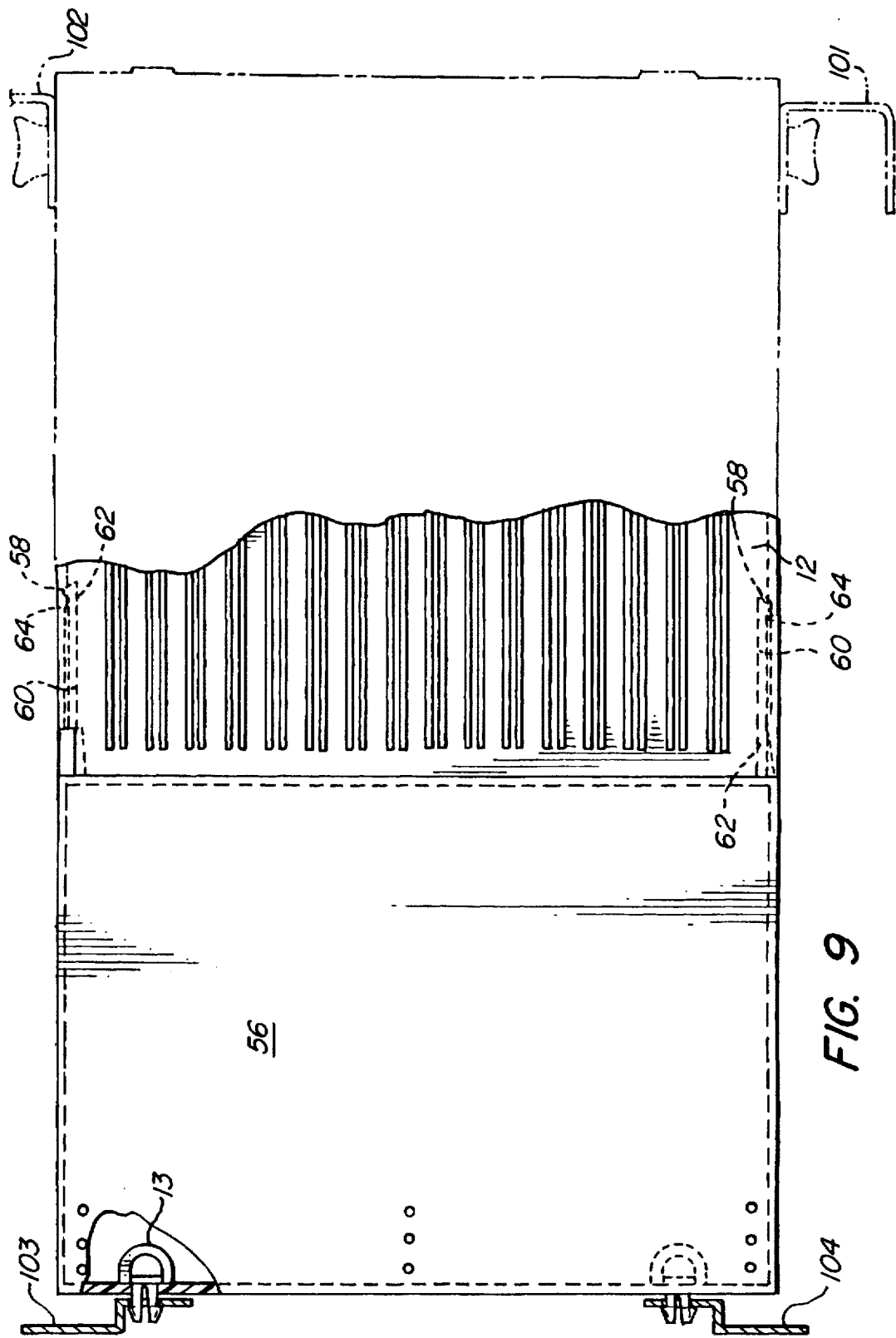

SELF-ADJUSTING STATIC DISSIPATIVE SHELF ASSEMBLY

BACKGROUND OF THE INVENTION

1. Field of the Invention

The present invention relates to a static-dissipative shelf assembly for supporting electronic circuit boards, and more particularly, to such a shelf assembly which is self-adjusting for supporting circuit boards of variable width or height therebetween, which can be mounted in a storage chamber, such as a cabinet, case, or container.

2. Description of Prior Art

Circuit boards, such as those used by the telecommunication and electronic industries, contain expensive solid state and microelectronic components which are extremely sensitive to static electricity. Often, such boards can run in the thousands or tens of thousands of dollars each, yet can be destroyed by transient static charges such as those which sometimes jump from a person's hand to a metal handrail or the like under conditions of low humidity. Such circuit boards can also be destroyed by the uncontrolled, rapid discharge of components thereon after removal of the boards from active service in a computer, switching system, or the like. It is therefore necessary to protect such circuit boards against ambient static charges and against rapid discharge of the components on the circuit board.

Prior solutions to the static and discharge problems have centered around containers for the circuit boards, such as plastic bags or cartons, which are rendered conductive with an appropriate antistatic agent. Chemical agents for providing antistatic properties are disclosed, for example, in U.S. Pat. No. 3,405,001. Examples of known antistatic containers for electronic parts are provided in U.S. Pat. Nos. 4,293,070 and 4,231,901. The 4,293,070 patent discloses a container composed entirely of paperboard coated on the inside surfaces with conductive carbon black particles to prevent an outside static electricity charge from passing through the container. In the 4,231,901 patent, a urethane foam having electrically conductive properties is used to wrap electronic components to protect them from static charge. The foam contains a binding agent and is impregnated generally uniformly therethrough with an electrically conductive amount of an electrically conductive particulate material, e.g. carbon-black, silver, aluminum, or a metal salt. U.S. Pat. No. 4,223,368 discloses an electrostatic discharge protection device adapted to be clipped onto edge connectors of a circuit card assembly. The device includes a shunt for electrically short circuiting the edge connectors of the card.

When removing circuit cards from electronic mainframes, it is inconvenient to re-package the boards in individual storage containers such as the cartons or bags described above. However, it is imperative that such boards be stored, for future use, in a manner which will protect them against damage from electrostatic discharge. It would therefore be advantageous to provide a storage facility, such as a cabinet or other container, into which the circuit boards, can be placed for convenient retrieval when needed, and which protects the circuit boards and the components thereon from damage due to electrostatic discharge. Such a cabinet should provide flexibility in terms of the types and sizes of circuit boards which it can accommodate.

A first attempt at such a container assembly is illustrated in U.S. Pat. No. 4,506,785. In this patent, a circuit board container assembly includes a box with internal side wall slots for receiving dividers in which are formed vertical slots and into which are placed printed circuit boards. The dividers are color coded to indicate discrete offset positionings of edge tabs on the respective dividers. The offset positioning of the edges permits the selection of dividers which are mounted in the wall slots to provide spacings of the bottoms of the dividers slots at distances closely approximating the width of the circuit boards placed in the slots so that the boards are snugly held during transport of the box. However, the adjustment is finite limited by the fixed offset position of the edge tabs.

The container is formed from static dissipative material so that any electrostatic charge retained on the circuit board or on any components of the container will be conducted from the board through the container to ground rather than from board to board to damage the same. The container is preferably injection molded from a structural polyethylene which has been treated to render it conducting or static dissipative. One material which can be used for this purpose is the "low ohmic" conductive plastic sold by ACO, Inc. of Oklahoma City, Okla. Two electrical characteristics are of concern in choosing a suitable conductive plastic for use in the shelf. The first is the ability of the material to safely dissipate the charge on a printed circuit board. If the shelf material is too conductive, electrostatic discharge can occur due to the rapid discharge of the printed circuit board through the shelf. It has been found that an ohmic material with a sheet resistance of $10^5$ to $10^{13}$ ohms per square is sufficient to safely discharge charged devices. The conductive plastic manufactured by ACO, Inc. and referred to above has a sheet resistance in the $10^{10}$ to $10^{13}$ ohms per square range.

The second electrical factor of importance in such a material is the ability to dissipate charge that may be generated due to triboelectric factors. For instance, when dragging the material across a benchtop or across a floor, the rubbing of the material against the dissimilar material of the benchtop or floor can create static charge. The ability of the material to dissipate this charge is measured by its decay rate. A suitable material, such as that manufactured by ACO, Inc. referred to above, should have a decay rate of about 2 seconds or less when charged to 3,000 volts.

Nevertheless, no provision was made to store and house such printed circuit boards in an upright storage cabinet. One early attempt to do so is illustrated in U.S. Pat. No. 4,277,120. In this patent, a printed circuit board storage cabinet provides for guided retention of circuit boards between interengaged modular retaining members which are readily interchangeable to enable simultaneous storage of circuit boards having differing widths and which provide enhanced structural rigidity of the storage cabinet. However, no path to conduct the charge from the container to ground was provided although this container did attempt to have limited or finite adjustability as provided in the container of U.S. Pat. No. 4,506,785, to take into account the storage of different sized circuit boards.

The first storage cabinet which both fully accounted for retention and support of any sized circuit board and which included both a coarse and fine adjustment for that purpose while enabling accumulated charge on the circuit board to be conducted to ground to prevent damage to the boards housed within the cabinet is illustrated in U.S. Pat. No. 4,555,744. This cabinet utilizes shelves depicted in U.S. Pat. No. 4,563,722.

In the cabinet of U.S. Pat. No. 4,555,744, an antistatic shelf for adjustably supporting electronic circuit boards in a storage cabinet is provided. The shelf comprises a base of conductive material in the range of $10^5$ to $10^{13}$ ohms per square having parallel planar top and bottom surfaces. A plurality of parallel rail pairs extend outwardly from the top surface of the base. The rails in each pair are spaced apart a first distance, and adjacent rail pairs are spaced from each other by a second distance. A complimentary plurality of rail pairs extends outwardly from the bottom surface of the base and in alignment with the rail pairs extending from the top surface. Means are provided for adjustably mounting the base in a storage cabinet. The shelf is molded as a unit from a conductive plastic.

In use, several shelves are arranged in a storage cabinet in a stacked arrangement. The spacing between successive shelves is determined by the height of circuit boards to be stored between those shelves. A circuit board to be stored is slid into grooves formed in the top surface of a lower shelf and corresponding grooves in the bottom surface of an upper shelf mounted directly above the lower shelf. Different height circuit boards are easily accommodated by adjusting the separation between the lower and upper shelves. Different width circuit boards are accommodated by variable width grooves provided on the shelves. Thus, for example, if the rails in each rail pair forming the grooves are closer together than the rails of adjacent rail pairs, a thin circuit board would be supported between the rails of a rail pair, and a relatively thicker circuit board would be supported between the rails of adjacent rail pairs.

These shelves are mounted in a rectangular parallelopiped housing. Lugs attached to each ear on the shelf are dropped within the interior of each bracket and the shelf is slid to a position intermediate the ends of the bracket and the lugs attached to each ear tightened to clamp the shelf in place. A level can be used to assure that the top and bottom surface of each shelf is level or even relative to a horizontal plane. A second shelf is then slid along the brackets and clamped into place relative to the first shelf. Individual plug-in circuit board modules can then be slid between the top surface of the lower shelf and the lower surface of the top shelf in a pair of facing slots. Should the module be provided with a laterally extending circuit element, it can be received within the larger width slot on the top surface of the lower shelf adjacent to the slot in which the module is positioned. By placing the plug-in module in a substantially upright condition between a pair of shelves in the storage cabinet, each module can be cataloged and marked for future use and reference.

Any electrostatic or triboelectrically generated charge on the printed circuit board can be conducted through the shelf, the shelf brackets in the cabinet and the cabinet housing, safely to ground.

Other shelf assemblies have also been devised to have such infinite, vertical adjustable space to encapsulate or capture different sized circuit boards therebetween. A three-piece construction is illustrated in U.S. Pat. No. 5,008,799.

A shelf assembly having an infinitely vertically adjustable top surface is provided for supporting electronic circuit boards in a storage cabinet. The shelf assembly includes a shelf base having a bottom support surface and a front and rear wall wherein the front wall defines at least one horizontally extending elongate slot therein. A vertical adjustment tray is positioned on the support surface of the shelf base and includes a front wall and rear wall which each define at least one elongate slot therein which extends generally laterally and upwardly. Vertical adjustment knob elements are secured to the front wall of the vertical adjustment tray and extend through the elongate slot in the front wall of the shelf base so that lateral movement of the knob member will laterally translate the vertical adjustment tray relative to the shelf base. A shelf top is positioned on the vertical adjustment tray and movably secured relative to the shelf base so as to prevent lateral movement thereof while allowing vertical movement relative to the shelf base. The shelf top also has front and rear walls with slot engagement pegs extending inwardly therefrom and into operative engagement with at least one upwardly extending slot in each of the front and rear walls of the vertical adjustment tray whereby lateral movement of the knob elements of the shelf assembly causes the vertical adjustment tray to laterally translate relative to the shelf base and the shelf top to be vertically actuated by the lateral movement thereof.

U.S. Pat. No. 5,168,431 illustrates a similar, three-piece shelf construction for use in a storage cabinet.

However, none of the static dissipative shelf constructions of the prior art are self-adjusting. Manual means must be provided for raising and lowering the shelf to provide infinite adjustability.

SUMMARY OF THE INVENTION

The present invention, on the other hand, relates to a self-adjusting shelf mounted in a storage cabinet which has a fixed upper unit and a relatively movable lower unit which is automatically level and self-adjusting upon insertion of a circuit board between the lower unit of an upper shelf assembly and the upper fixed unit of an adjacent lower shelf assembly. No tools or other manual means are needed to effect a fine adjustment of the height between adjacent shelf units. Further, the circuit board can be inserted using only one hand, reducing the possibility of static discharge between the person handling the board and the components on the board, while rendering more convenient, use of the storage facility. The resultant support of the circuit board is floating which can adjust to severe shocks or jolts such as experienced in earthquakes without dislodgment or damage to the boards, as would be the case where the adjacent shelves are fixed or locked in position relative to each during use. Finally, each shelf unit pair comprises a support system for the circuit boards inserted therebetween. There is no cumulative weight on adjacent shelf units as there is on shelves fixed to the side rails of a cabinet which receive the cumulative weight of all the boards supported on an upper shelf which is transmitted through the boards to the shelf below.

The aforementioned objectives are accomplished by spring loading the lower shelf unit relative to the upper fixed unit mounted at discrete locations within a storage cabinet. The spring means are connected at one end to the fixed upper shelf unit and is extended or placed under tension and its other end connected off-center with respect to the axis of rotation of a triangular bracket whose apex is fixed to the front edge of the lower unit to provide a component of force to urge the lower unit away from the upper unit. The front portion of the lower unit is pivotable relative to the rear of the unit. The rear portion of the lower unit is connected to the upper fixed shelf unit and cabinet by means of a linkage, which, in conjunction with the pivotable front shelf portion of the lower unit, forms a pantograph or parallelogram linkage system, so that the rear portion of the lower shelf unit is always maintained in parallel relation to the fixed, upper shelf unit mounted at discrete locations within the cabinet. Insertion of a circuit board between the movable lower unit of one shelf and a facing upper fixed unit of an adjacent shelf assembly will cause the space therebetween to self-adjust by pushing the lower unit rearwardly and causing it to swing or pivot against the force of the extending spring into clamping relation with the top of the circuit board. Not only is the assembly thus self-adjusting and auto-levelling, but the travel of the lower shelf unit of the assembly is not restricted to the depth of the shelf assembly, enabling greater space utilization of the interior of the cabinet, which was not possible with prior art shelf assemblies whose fine adjustment was limited to the depth of the base shelf.

Means are also provided to lock, if desired, the relative adjusted position of the lower unit of the upper shelf assembly relative to the upper unit of the adjacent lower shelf assembly once the shelf positions have stabilized.

BRIEF DESCRIPTION OF THE DRAWINGS

Further objects and advantages of the invention will become apparent from the following description and claims, and from the accompanying drawings, wherein:

FIG. 3 is a partial, exploded view with portions broken away for purposes of illustration of one of the shelf assemblies of FIG. 1;

FIG. 7 is a rear view in elevation of a top shelf unit of the shelf assembly of FIG. 1 with one side edge thereof broken away and illustrated in section;

FIG. 8 is a fragmentary perspective view of one of the corners of a shelf extension unit utilized with the shelf unit of FIG. 7 to enlarge the depth of a shelf assembly; and FIG. 9 is a view similar to FIG. 4 but with the shelf assembly illustrated in FIG. 1 mounted in a larger cabinet using the extension unit of FIG. 8.

DETAILED DESCRIPTION OF THE PREFERRED EMBODIMENT

Figure 1:
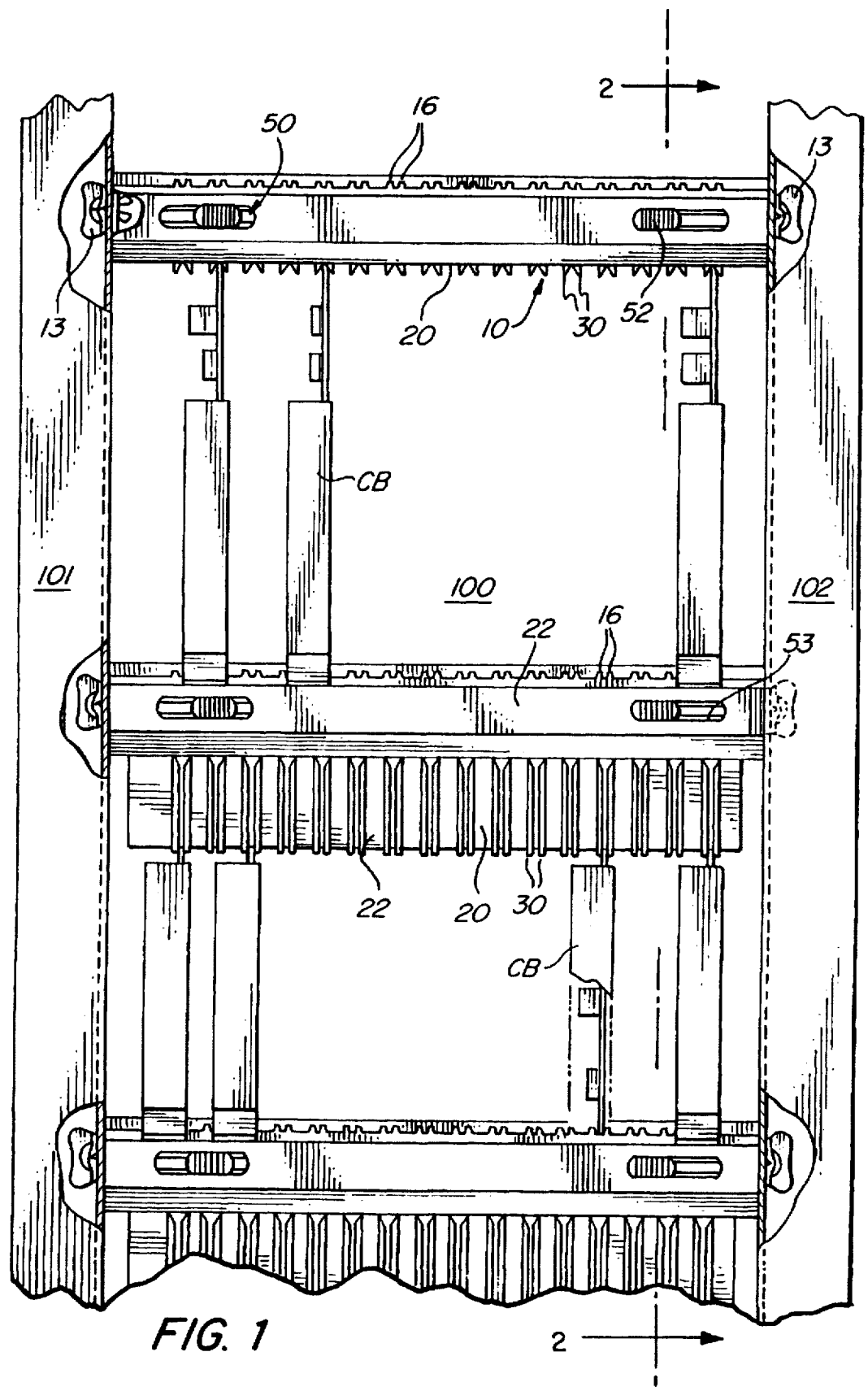
FIG. 1 is a front view of a plurality of shelf assemblies of the present invention mounted in a storage cabinet.

Referring now to the drawings in detail, wherein like numerals indicate like elements throughout the several views, the self-adjusting shelf assembly 10 includes an upper unit 12 fixed by fasteners 13 in brackets 101, 102, 103 and 104 in a storage cabinet 100, and a lower unit 14, each of which is provided with spaced rail pairs 16 on both their upper and lower surfaces 18, 20, respectively.

Figure 2:
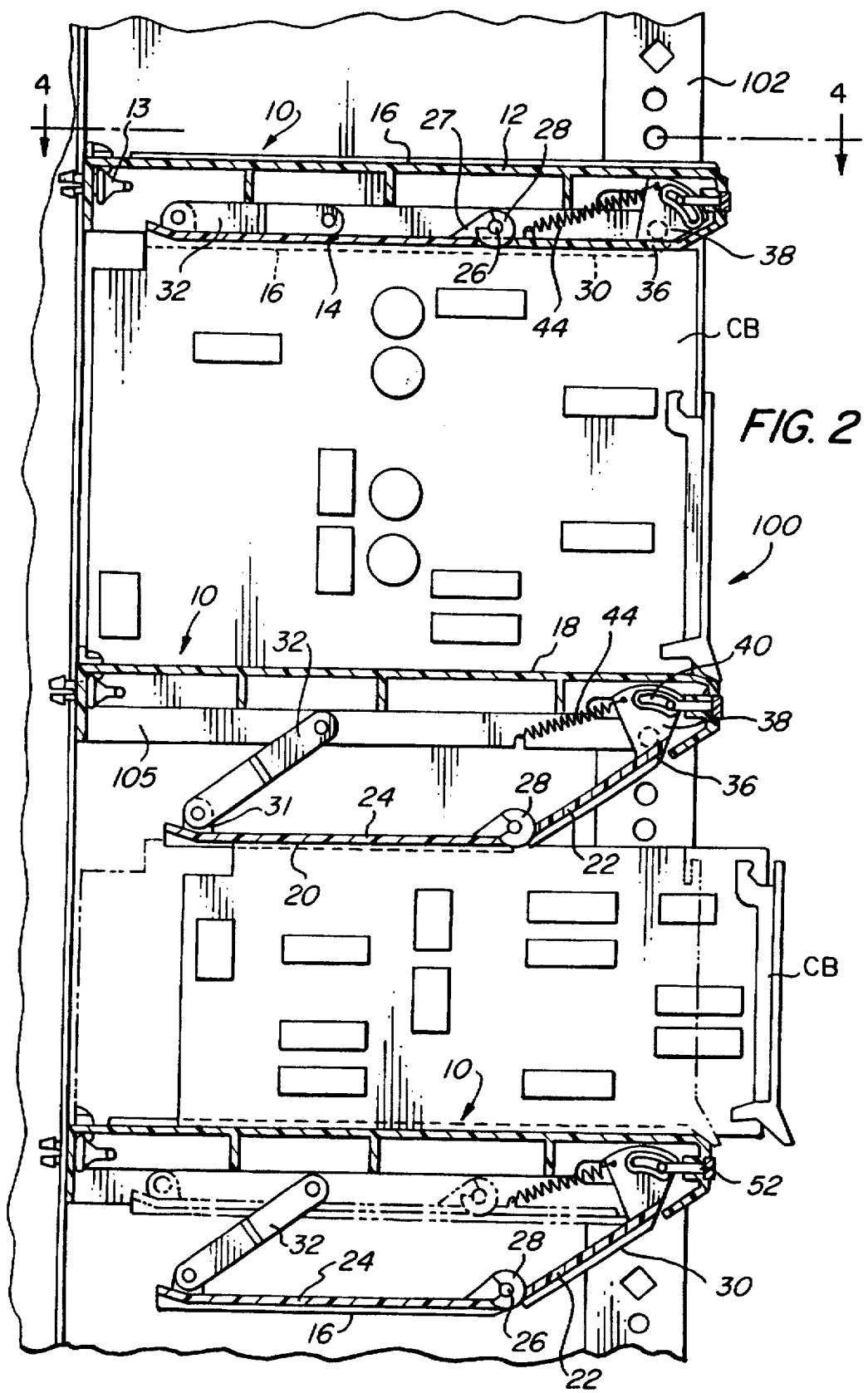
FIG. 2 is a longitudinal cross-sectional view taken substantially along the plane indicated by line 2—2 of FIG. 1.
Figure 5:
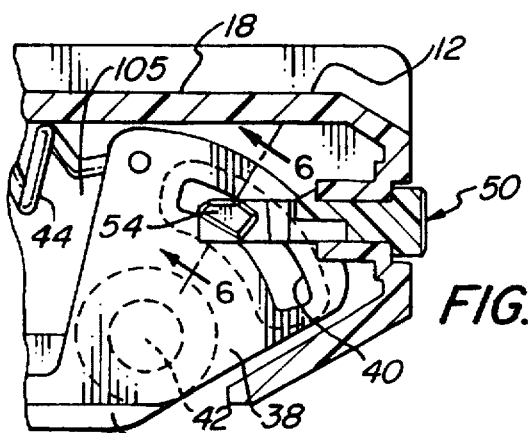
FIG. 5 is a cross-sectional view taken substantially along the plane indicated by line 5—5 of FIG. 4 and illustrating the locking mechanism for locking the shelf assembly in its adjusted position.
Figure 6:
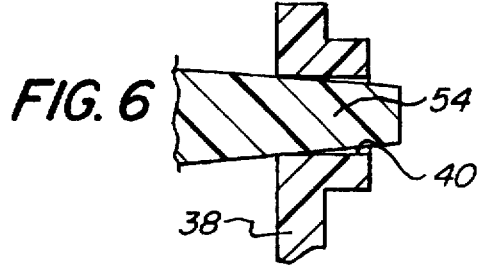
FIG. 6 is a cross-sectional view taken substantially along the plane indicated by line 6—6 of FIG. 5.

The rail pairs 16 on the lower surface 20 of a first or upper shelf assembly 10 is at the same relative corresponding location and extend in the same direction as the rail pairs 16 on the facing upper surface 18 of a second or lower shelf assembly 10, so that a circuit board CB can be inserted between corresponding rail pairs, as shown in FIGS. 1 and 2.

The upper and lower shelf units 12 and 14 of each shelf assembly 10 are both molded from a polycarbonate resin which has both antistatic and static dissipative properties; the latter being defined by a resistivity of $10^5$ to $10^{13}$ ohms per square. Above $10^{13}$ ohms per square is insulative and under $10^5$ ohms per square is too conductive, causing any electrostatic charge accumulated on the board CB to be too rapidly led through the shelf unit 10 or 12 and possibly causing sparking between components on the circuit board CB mounted thereon.

Any electrostatic or triboelectrically generated charge on the printed circuit board CB can be conducted through the supporting shelf units 12, 14 of adjacent shelf assemblies 10, through one or more of brackets 101, 102, 103, and 104 in cabinet 100 and the cabinet housing, safely to ground.

The lower unit 14 of the shelf assembly 10 is adapted to be moved relative to the upper unit 12 of an adjacent, lower shelf assembly 10 to finely self-adjust the space between these units of the adjacent shelf assemblies to accommodate different sized circuit boards in the cabinet 100 between the bottom surface 20 of the lower unit 14 and the upper surface 18 of the upper unit 12 of adjacent shelf assemblies 10. To accomplish this objective, the bottom surface 20 of each lower unit 14 of each shelf assembly 10 is adapted to move parallel to the upper surface 18 of each upper fixed unit 12 which is fixed to the brackets 101, 102, 103 and 104 of the cabinet 100 by fasteners 13. The bottom surface 20 of each lower unit 14 also moves parallel to the upper surface 18 of an upper unit 12 of a lower, adjacent shelf assembly 10. The adjacent assembly 10 is also fixed to the cabinet at a predetermined distance from the upper unit 12 of first shelf assembly 10 to initially define a coarse adjustment or approximate space equal to the width of a circuit board CB received therebetween. The added movement of the lower unit 14 of the upper shelf assembly 10 parallel to the upper unit 12 of the lower adjacent shelf assembly 10 is a fine adjustment designed to cover the gambit of all possible height variations of a circuit board CB which can occupy the approximate space and be supported between the adjacent shelf assemblies 10. In this manner, the shelf assemblies are rendered infinitely adjustable.

In order to accomplish the fine adjustment of the lower unit 14 of the upper shelf assembly 10 relative to the upper fixed unit 12 of the adjacent lower shelf assembly 10, the front portion 22 of the lower unit 14 of the upper shelf assembly 10 is hinged to the rear portion 24 thereof by a pivot pin 26 extending from an ear 28 on opposed sides thereof and inserted into an upright, overlapping circular ear 27 on opposed sides of the front of the rear portion 24 of the lower unit 14 of the upper shelf assembly 10. The front portion 22 has rail pairs 30 coextensive with those on the rear portion 24 and the pivotable front portion 22 of lower unit 14 forms one link of a pantograph or parallelogram linkage system. A second pair of links 32 pivotably connected between each of the adjacent sidewalls 105, 106 of the upper fixed unit 12 of each shelf assembly 10 and spaced ear 31 on the rear edge of rear portion 24 of the lower shelf unit 14 maintain the rear portion 24 in a horizontal and coplanar relationship to the upper surface 18 of the fixed shelf unit 12 of each shelf assembly 10. The links 32 between the sidewalls 105, 106 of the upper fixed shelf unit 12 and the rear portion 24 of the lower shelf unit 14 remains parallel at all times to the front portion 22 of the lower shelf unit 14 as the front portion 22 pivots about pin 26 relative to the rear portion 24 of the lower shelf unit 14.

The front edge 36 of the front portion 22 of the lower shelf unit 14 is provided with upright, spaced triangular-shaped brackets 38, each having an arcuate slot 40 adjacent its larger side. The brackets 38 can be molded as part of the front edge 36 along with a pintle 42 which is pivotably mounted in an ear 43 provided on the opposed interior sides 105, 106 of the front portion of the fixed upper shelf unit 12. While fixing the front edge 36 to the sidewalls of the cabinet 100 via the sidewalls 105, 106 of shelf unit 12, brackets 101, 102, 103 and 104, the pintle 42 also enables the triangular bracket 38 to rotate with the front edge 36 in ear 43.

An elongated coil spring 44 is extended under tension and connected at one end off-center to the axis of rotation (or axis of pintle 42) of each triangular bracket 38 and the other end is attached to the adjacent depending side wall 105, 106 of upper unit 12. The spring 44 exerts a component of force on bracket 38 which tends to rotate each bracket 38 and the front portion 22 of the lower shelf unit 14 in a counterclockwise arc as viewed in FIG. 2, away from the upper fixed shelf unit 12 to the phantom position illustrated in FIG. 3.

Upon insertion of a circuit board CB between the rails 30 of the front portion 22 of the lower shelf unit 14 and the fixed, upper portion 12 of an adjacent shelf assembly 10, the rails 30 on the front portion 22 will serve as a guide for the board and will be re-pivoted in a clockwise direction as viewed in FIGS. 2 and 3 about the pintles 42 to a position closer to the fixed upper unit 12 of its shelf assembly 10. The maximum travel will be to the position illustrated in the full line position of FIG. 3 wherein the front and rear portions 22, 24 of the lower shelf unit 14 of the shelf assembly 10 are coplanar. The contracted coil spring 44 will tend to push the rear portion 24 of the lower shelf unit 14 away from the fixed upper unit 12 to clamp the circuit board CB between the lower shelf unit 14 and the upper fixed unit 12 of the adjacent shelf assembly 10, as viewed in FIG. 2.

A lock 50 is provided once the lower unit 14 of the shelf assembly 10 has reached its stabilized position to encapsulate the full height of a circuit board CB inserted between the rails 16 on the rear portion 24 of lower shelf unit 14 and the rails 16 on an adjacent facing fixed upper shelf unit 12. The lock 50 consists of a knurled knob 52 seated in a lateral slot 53. The knob 52 is connected to a wedge-shaped pintle 54 which is adapted to be slid into contact with and into an interference fit with the sides of the arcuate slot 40 in the bracket 38 to prevent the bracket 38 from rotating, raising or lowering the lower shelf unit 14 of the shelf assembly 10.

However, in earthquake prone regions, it may be desirable not to lock the lower unit 14 of the shelf assembly 10, but allow it to float to absorb shocks and jolts without dislodgment of the boards CB.

Figure 4:
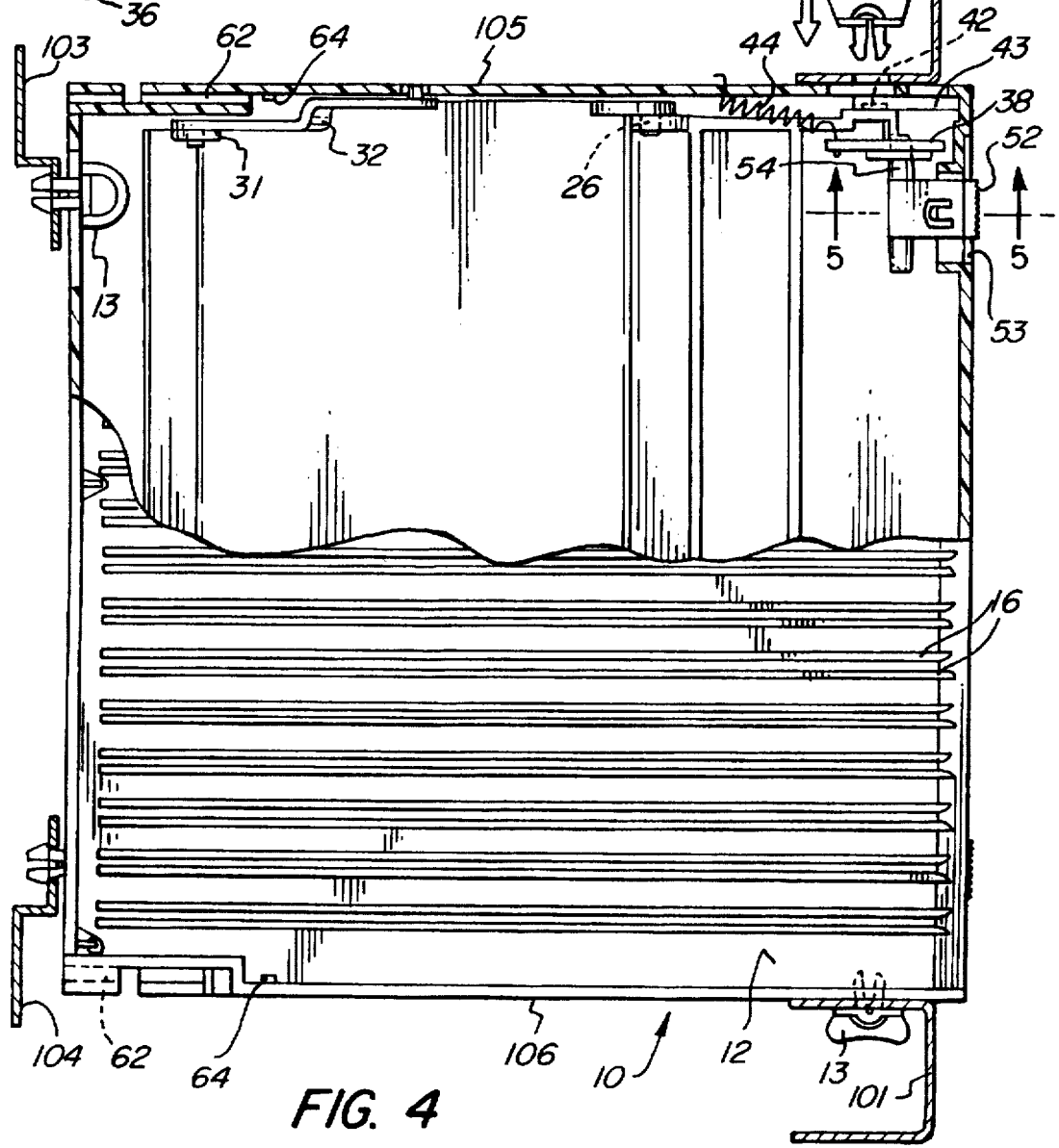
FIG. 4 is a cross-sectional view taken substantially along the plane indicated by line 4—4 of FIG. 2, with portions of the top shelf unit of the shelf assembly broken away.

In order to increase the depth of each shelf assembly 10 so it can be mounted in a larger cabinet 100 to support longer circuit boards CB, the upper unit 12 of the shelf assembly 10 may be provided with a flat extension 56, as illustrated in FIGS. 7 to 9, inclusive. The extension 56 includes resilient hooks 58 extending on spaced arms 60 attached to one edge thereof received in a slot 62 for snap engagement around a vertical rail 64 on the walls 105, 106 of the rear portion of the upper shelf unit 12 (see FIGS. 4 and 9). In the event it is necessary to mount the shelf assembly 10 in a deeper cabinet, a shelf extension 56 can also be attached to the immobile upper fixed portion 12 of a lower, adjacent shelf assembly for additional support of a longer circuit board CB mounted in the cabinet 100.

What is claimed is as follows:

1. Apparatus for adjustably supporting electronic circuit boards in a conductive storage chamber having side walls comprising:

at least one pair of spaced shelf assemblies each having a first and relatively movable second unit formed from static dissipative material, the first unit of each shelf assembly being adapted to be fixed to the side walls of said chamber so that the second unit of one of said shelf assemblies faces the first unit of the other of said pair of shelf assemblies, a plurality of corresponding located, parallel grooves defined by spaced rail pairs of on the facing surfaces of the first and second units of the pair of shelf assemblies, and means on each shelf assembly mounting the second unit of the assembly with respect to the first unit for movement so that at least a portion of said second shelf unit remains parallel to said fixed first shelf unit as the distance between said first and second units is adjusted, said mounting means including biasing means for forcing said second unit away from said first unit to self-adjust the distance between said second unit of one of said shelf assemblies and the facing first fixed unit of the adjacent shelf assembly, whereby upon insertion of an electric circuit board into corresponding grooves on the facing surfaces of said shelf assemblies, the surface of said second unit having said grooves may move relative to the fixed first unit of said other shelf assembly provided with said grooves to accommodate the height of and restrain a circuit board inserted therebetween.

2. The apparatus of claim 1 wherein means are provided to lock the relative adjusted position of said shelf units of said shelf assemblies with respect to each other.

3. The apparatus of claim 1 wherein said mounting means includes:

a front portion of said second unit of each shelf assembly pivotably connected along its rear edge to the front edge of a rear portion thereof and along its front edge to said fixed, first shelf unit, and linkage means parallel to said front portion of said second shelf unit pivotably securing the rear portion of said second shelf unit to said fixed, first shelf unit.

4. The apparatus of claim 3 wherein said biasing means includes:

bracket means rotatably mounted along the front edge of said front portion of said second unit, and spring means between the fixed, first unit of said shelf assembly and said bracket means for rotating said bracket means to move said second unit away from said first unit.

5. The apparatus of claim 4 wherein said bracket means is triangular in plan with its apex rotatably connected to the front edge of said first unit and said spring means is connected to said bracket means off center to the axis of rotation of said apex.

6. The apparatus of claim 5 wherein means are provided to lock the relative adjusted position of said shelf units of each said shelf assembly with respect to each other.

7. The apparatus of claim 6 wherein said lock means includes an arcuate slot in said bracket means, and a laterally movable pin on the first unit of said shelf assembly provided with a reduced diameter portion adapted to be slid into wedging engagement in said slot in said bracket means to preclude rotation of the same.

8. The apparatus of claim 1 including an extension shelf having means for engaging an edge of said first unit for increasing the length of said shelf when mounted in a chamber.

9. The apparatus of claim 8 wherein said edge engagement means is a hook received in said first unit.

10. A self-adjusting shelf assembly for use in supporting electronic circuit boards within side walls of a conductive storage chamber comprising:

a first and second unit formed from static dissipative material, the first unit being adapted to be fixed to the walls of the storage chamber, a plurality of corresponding located, parallel grooves defined by spaced rail pairs on the top surface of the first unit and the bottom surface of the second unit of the shelf assembly, and means mounting the second unit on the first unit for relative movement so that at least a portion of the second shelf remains parallel to the first shelf unit as the distance between the first and second units is adjusted, the mounting means including resilient biasing means for urging the second unit away from the first unit.

11. The shelf assembly of claim 10 wherein means are provided to lock the relative adjusted position of said shelf units with respect to each other.

12. The shelf assembly of claim 10 wherein said mounting means includes:

a front portion of said second unit pivotably connected along its rear edge to the front edge of a rear portion thereof and along its front edge to said first shelf unit, and linkage means parallel to said front portion of said second shelf unit pivotably securing the rear portion of said second shelf unit to said first shelf unit.

13. The shelf assembly of claim 12 wherein said biasing means includes:

bracket means rotatably mounted along the front edge of said front portion of said second unit, and spring means between the fixed, first unit of said shelf assembly and said bracket means for rotating said bracket means to move said second unit away from said first unit.

14. The shelf assembly of claim 13 wherein said bracket means is triangular in plan with its apex rotatably connected to the front edge of said first unit and said spring means is connected to said bracket means off-center to the axis of rotation of said apex.

15. The shelf assembly of claim 14 wherein means are provided to lock the relative adjusted position of said shelf units with respect to each other.

16. The shelf assembly of claim 15 wherein said lock means includes an arcuate slot in said bracket means, and a laterally movable pin on the first unit of said shelf assembly provided with a reduced diameter portion adapted to be slid into wedging engagement in said slot in said bracket means to preclude rotation of the same.

17. Apparatus for adjustably supporting electronic circuit boards in a conductive storage chamber comprising:

at least one pair of spaced shelf assemblies each having a first and relatively movable second unit formed from static dissipative material and mounted in said storage chamber so that the second unit of one of said shelf assemblies faces the first unit of the other of said pair of shelf assemblies, a plurality of corresponding located, parallel grooves defined by spaced rail pairs on the facing surfaces of the first and second units of said pair of shelf assemblies, and means on each shelf assembly mounting the second unit of the assembly with respect to the first unit for movement so that at least a portion of said second shelf unit remains parallel to said fixed first shelf unit as the distance between said first and second units is adjusted, said mounting means including biasing means for forcing said second unit away from said first unit to self-adjust the distance between said second unit of one of said shelf assemblies and the facing first fixed unit of the adjacent shelf assembly, whereby upon insertion of an electric circuit board into corresponding grooves on the facing surfaces of said shelf assemblies, the surface of said second unit having said grooves may move relative to the fixed first unit of said other shelf assembly provided with said grooves to accommodate the height of and clamp a circuit board inserted therebetween.

18. Apparatus for automatically and adjustably securing an article in a compartment having side walls comprising:

a pair of spaced shelf assemblies, one shelf assembly having a first and second unit, the second unit of the shelf assembly being mounted to and adapted for movement relative the first unit, each shelf assembly being fixedly attached to the walls of the chamber so that the second unit of the one of the shelf assemblies faces a facing surface of the other of the pair of shelf assemblies;

a plurality of corresponding located, parallel grooves defined by spaced rail pairs on the facing surfaces of each of the shelf assemblies;

means on the one shelf assembly for mounting the second unit relative the first unit for movement of at least a portion of the second unit such that the portion of the second shelf unit remains parallel to the first shelf unit as the distance between the first and second units is adjusted, and resilient biasing means for forcing the second unit away from the first unit to self-adjust the distance between the second unit of the one of the shelf assemblies and the facing surface of the other of the pair of shelf assemblies, whereby upon insertion of an electric circuit board into corresponding grooves on the facing surfaces of the shelf assemblies, the surface of the second unit having the grooves may move relative to the facing surface of the other of the pair of shelf assemblies provided with the grooves to accommodate the height of and clamp a circuit board inserted therebetween.

19. Apparatus for adjustably supporting items in a storage chamber having side walls comprising:

a pair of spaced shelf assemblies, at least one of the pair of shelf assemblies having a first and second shelf unit, the second unit of the one of the shelf assemblies being mounted to and adapted for movement relative the first unit, the first unit of the one of the pair of shelf assemblies being fixedly attached to the walls of the chamber such that the second unit of the one of the shelf assemblies faces a facing surface of the other of the pair of shelf assemblies;

means on the one of the pair of shelf assemblies for mounting the second shelf unit to the first shelf unit for movement so that at least a portion of the second shelf unit remains parallel to the fixed first shelf unit as the distance between the first and second units is adjusted; and resilient biasing means for forcing the second shelf unit away from the first shelf unit to self-adjust the distance between the second shelf unit of the one of the pair of shelf assemblies and the facing surface of the other of the shelf assemblies.

whereby upon insertion of the item between the one and the other of the shelf assemblies, the second unit of the one of the shelf assemblies may move relative to the other of the pair of shelf assemblies to accommodate the height of and clamp the item inserted therebetween.

20. A self-adjusting shelf assembly for use in supporting an item within a storage chamber having side walls comprising:

a first and second unit, the first unit being fixed relative the side walls of the storage chamber and the second unit have a front portion and a rear portion;

linkage means for mounting the second unit to the first unit for relative movement such that at least the rear portion of the second unit moves relative the first shelf unit as the distance between the first and second units is adjusted; and resilient biasing means coupled to the mounting means for urging the second unit away from the first unit, whereby upon insertion of the item in the storage chamber, the item urges the front portion of the second unit toward the first unit and automatically moves the rear portion of the second unit relative to the first unit to accommodate the height of and clamp the item so inserted.

21. The self-adjusting shelf assembly of claim 20, wherein the front portion of the second unit is inclined relative the first unit such that insertion of the item forces the second unit toward the first unit.

22. The self-adjusting shelf assembly of claim 21, wherein the linkage means is a parallelogram linkage for mounting the second unit to the first unit for relative movement, the linkage further comprising:

a rear linkage member pivotally attached to both the rear portion and the first unit and the first unit; and the inclined front portion of the second unit pivotally attached to both the rear portion of the second unit and the first unit, the rear portion of the second unit being oriented and remaining parallel to the first shelf unit as the distance between the first and second units is adjusted.

* * * * *